United States Patent [19]

Ekwall

[11] Patent Number: 5,541,507
[45] Date of Patent: Jul. 30, 1996

[54] DEVICE FOR DETECTING THE POSITION OF A MAGNET BY ANALYZING MOVEMENT OF A CURRENT-FED COIL DISPOSED IN THE MAGNETIC FIELD OF THE MAGNET

[75] Inventor: Christer Ekwall, Spanga, Sweden

[73] Assignee: Pacesetter AB, Solna, Sweden

[21] Appl. No.: 124,450

[22] Filed: Sep. 22, 1993

[30] Foreign Application Priority Data

Sep. 29, 1992 [EP] European Pat. Off. ............. 92116650

[51] Int. Cl.$^6$ .................................................. G01R 33/02
[52] U.S. Cl. ................... 324/207.13; 324/661; 324/260; 324/256; 324/226; 73/DIG. 4
[58] Field of Search ...................... 324/207.13, 207.11, 324/207.12, 207.22, 260–262, 256, 257, 244, 660, 661; 73/DIG. 4, 778–780, 517 AV; 310/311, 330, 327–328

[56] References Cited

U.S. PATENT DOCUMENTS

| | | | |
|---|---|---|---|
| 2,452,156 | 10/1948 | Schover | 324/207.13 |
| 3,898,555 | 8/1975 | Tellerman | 324/207.13 |
| 4,344,068 | 8/1982 | Thompson et al. | 324/207.13 |
| 4,721,902 | 1/1988 | Tellerman et al. | 324/207.13 |
| 4,887,032 | 12/1989 | Hetrick | 324/207.16 |
| 4,891,587 | 1/1990 | Squire | 324/260 X |
| 4,931,729 | 6/1990 | Pratt | 73/779 |
| 4,931,732 | 6/1990 | Moon | 324/228 |
| 5,001,426 | 3/1991 | Frey et al. | 324/260 |
| 5,036,286 | 7/1991 | Holm-Kenney et al. | 324/661 |
| 5,136,884 | 8/1992 | Lovett | 324/207.13 |
| 5,142,227 | 8/1992 | Fish | 73/779 |
| 5,146,165 | 9/1992 | Brown | 324/260 |
| 5,309,096 | 5/1994 | Hoegnelid | 324/256 |

FOREIGN PATENT DOCUMENTS

WO90/00030  1/1990  WIPO.

OTHER PUBLICATIONS

"A Vibrating Cantilever Magnetic-Field Sensor," Hetrick, Sensors and Actuators, vol. 16, No. 3 Mar., 1989, (pp. 197–207).

Primary Examiner—Walter E. Snow
Assistant Examiner—Jay M. Patidar
Attorney, Agent, or Firm—Hill, Steadman & Simpson

[57] ABSTRACT

A magnet position detector, particularly for implantable medical devices, has a resiliently supported coil, a current source delivering a current to the coil and a detecting device for detecting the movement of the coil in a magnetic field when fed with an electric current from the current source. The coil has a core with a non-linear B-H curve and the current source is a pulse source delivering current pulses with at least one positive and one negative side. The detecting device detects the movements of the coil in opposite directions respectively excited by differentiated signals respectively corresponding to the leading and trailing edges and permits the magnitudes of the respective, oppositely directed movements to be compared to each other, thereby indicating the position of a source of the magnetic field, relative to the coil, to be determined. The magnitudes of the oppositely directed movements can be measured by analyzing signals from a piezoelectric element attached to the coil for co-movement therewith, by analyzing the position of light beam reflected from a surface which co-moves with the coil, or by analyzing the change in capacitance of a capacitor having one plate which co-moves with the coil.

14 Claims, 7 Drawing Sheets

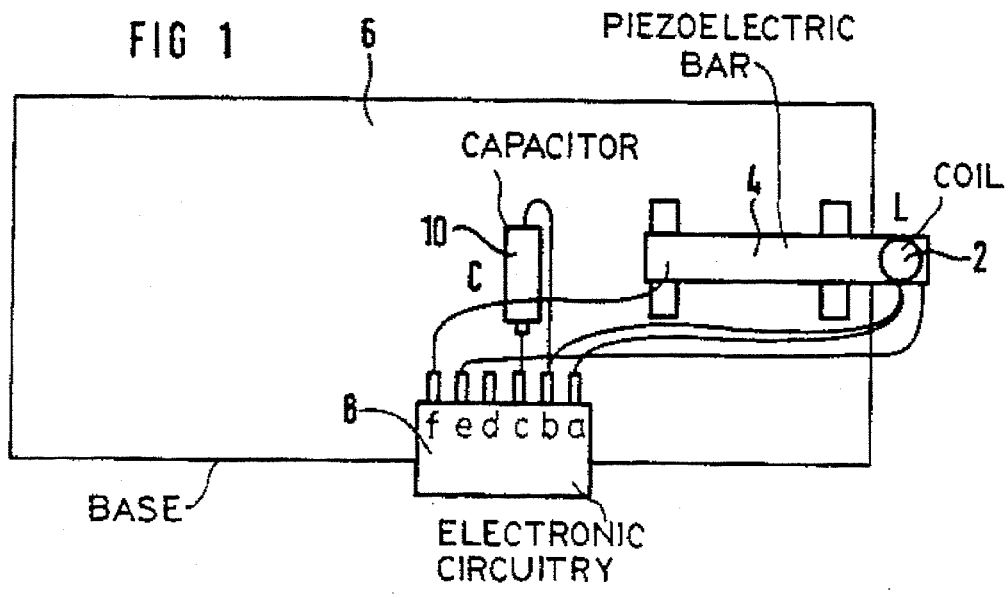
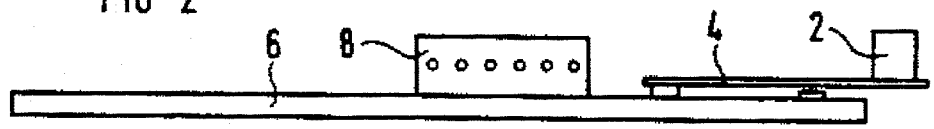
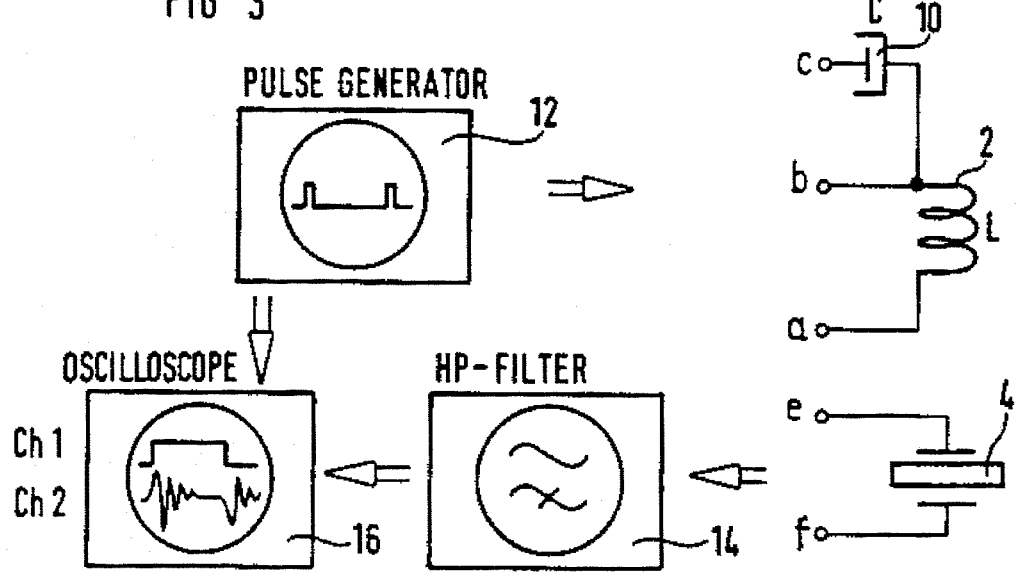

FIG 4
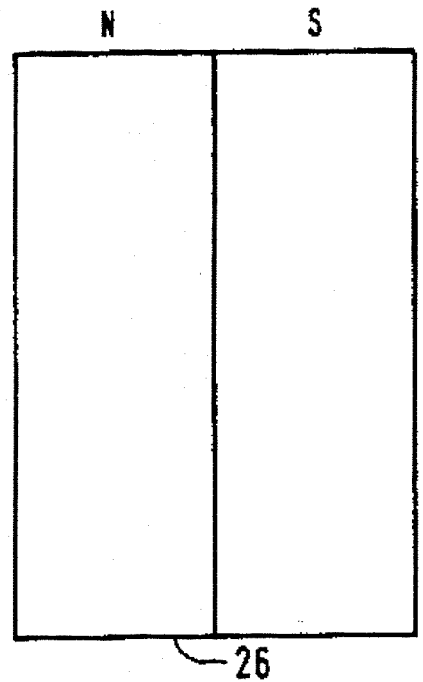
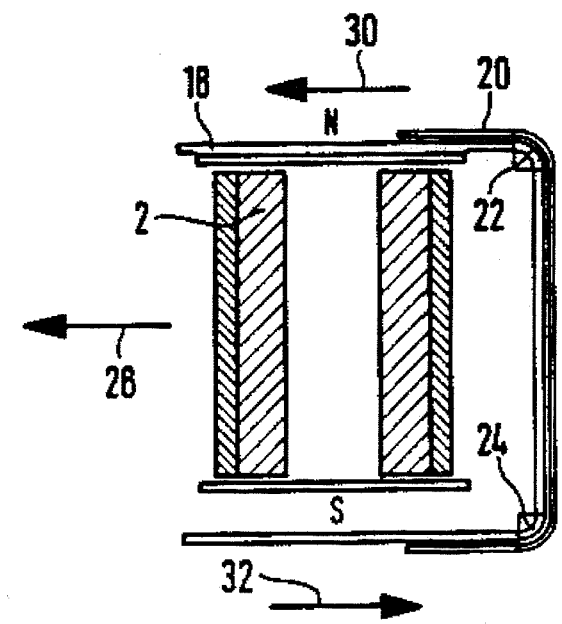
FIG 5
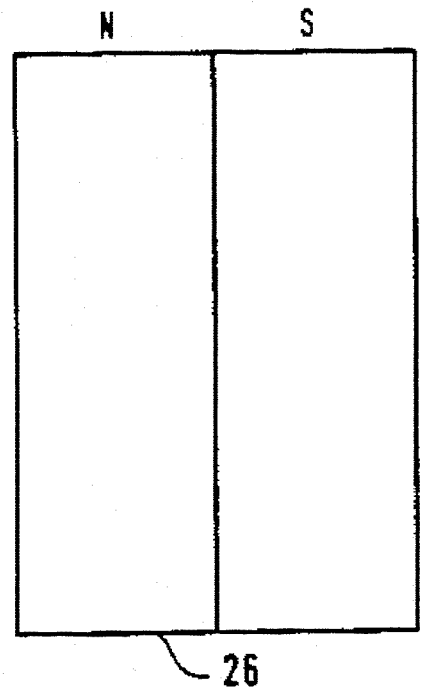
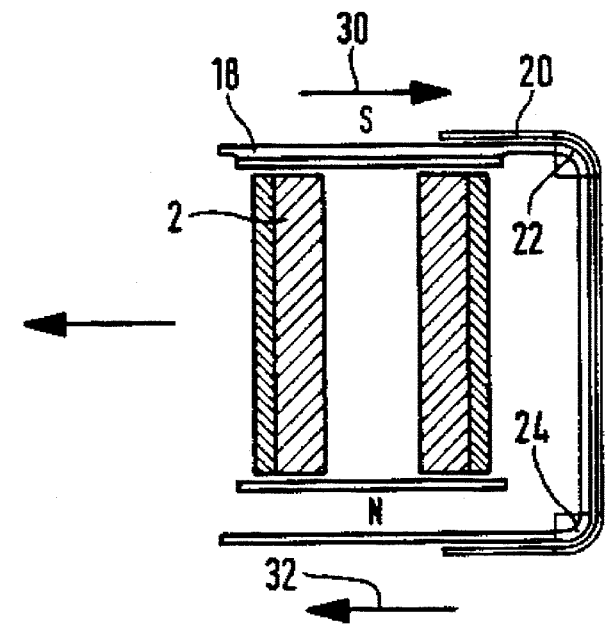

FIG 6
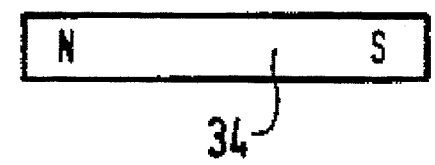 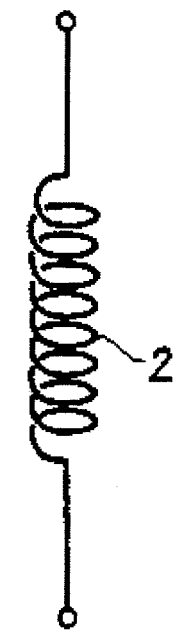
FIG 7
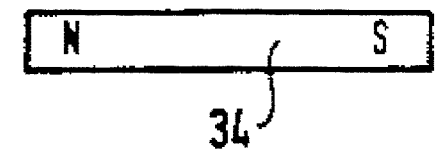 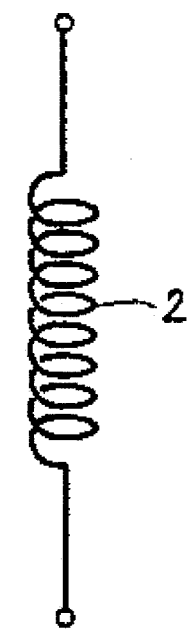

DEVICE FOR DETECTING THE POSITION OF A MAGNET BY ANALYZING MOVEMENT OF A CURRENT-FED COIL DISPOSED IN THE MAGNETIC FIELD OF THE MAGNET

BACKGROUND OF THE INVENTION

1. Field of the Invention

The present invention relates to a magnet position detector, particularly for implantable medical apparatuses, of the type having a resiliently supported coil, a current source delivering a current to the coil, and a detecting device for detecting the movement of the coil in a magnetic field when fed with an electric current from the current source.

2. Description of the Prior Art

U.S. Pat. No. 4,887,032 discloses a sensor for measurement of position, or sensing the passage of an object past a point, which sensor comprises a flexible bar member provided with a piezoelectric element. The bar has a free end of which a coil is supported, and is fixed at its opposite end. If the coil is located in a magnetic field, it will move if a current is passed through the coil and this movement of the coil will cause the piezoelectric bar to flex and a corresponding voltage will be produced by the associated piezoelectric element. This sensor is used for measuring the distance from an object to a reference point, or the rate at which an object passes a reference point to which object a magnet is attached or the object is formed of a material of magnetic permeability and is moving in a permanent magnetic field.

For implanted medical devices, like pacemakers, a magnet is often used for testing purposes. The battery status can, for instance, be detected by the application of a magnet to the implanted device. The exact location of the implanted device can often be difficult to determine and therefore it is also difficult to ascertain the correct location at which the magnet should be placed in relation to, e.g., a reed switch within an implanted pacemaker.

SUMMARY OF THE INVENTION

An object of the present invention is to provide a magnet position detector for determining and controlling the position of a magnet.

The above object is achieved in accordance with the principles of the present invention in a detector for identifying the position of a magnet having a resiliently supported coil, a current source for delivering current pulses to the coil, and a detecting circuit for detecting movement of the coil, while fed with the current pulses, in the magnetic field produced by the magnet. The current pulses each have a leading edge and a trailing edge and, due to the resilient mounting of the coil differentiated signals corresponding to these leading and trailing edges respectively cause physical movements of the coil in opposite directions in the magnetic field. By comparing the magnitudes of the movements in the opposite directions, one obtains an indication of how far the coil is to one side or the other of an axis of the magnet. When the oscillation amplitudes become equal, it is known that the axis of the magnet is aligned with the coil.

As current pulses are fed to the coil of the detector according to the invention, oscillations of the mechanical system carrying the coil are generated at the leading and trailing edges of the pulse and these oscillations are similar but of opposite phase. If the coil is placed on the axis of the magnet the oscillation amplitudes are equal but if the coil is offset the amplitude is larger on one edge than on the other as a result of the non-linear B-H curve of the core of the coil. If the magnet is turned 180° the larger and smaller amplitudes will change place. Thus the detector according to the invention can be used to detect displacements from the axis of the magnet, and thus used for, e.g., control of the position of a magnet, and also for identification of magnet poles. The coil preferably has a ferrite core.

The position detector can be used, for example to guide a magnet toward an implanted medical device, such as a pacemaker. Implanted pacemakers frequently include a magnetically responsive element, such as reed switch, which is activated by a hand-held, external magnet in order to change the mode of operation of the implanted device. Such implanted devices also usually include a telemetry unit, so that selected signals can be transmitted from the implanted device to an external receiver. By providing means at the external receiver to monitor the signals generated by the coil in the presence of the magnetic field produced by the magnet, it can be easily determined when the magnet is properly positioned relative to the coil, and thus relative to the magnetically responsive element.

According to one embodiment of the detector of the invention, the coil is supported by a resilient bar member which is piezoelectric or is provided with a piezoelectric element delivering an electric signal representative of the bending of the member and thus of the movement of the coil.

By bending the resilient member supporting the coil to form at least two shanks interconnected at one end, a mechanically more flexible construction is obtained. The improved flexibility results in a lower mechanical resonance frequency for the same dimensions of the device, which is an advantage, and a larger bending of the supporting member is obtained when the coil is tilted. If, e.g., a piezoelectric element is applied to the resilient member over the bend to give an electric signal representative of the bending of the member, this construction gives a higher sensitivity.

According to a further embodiment of the detector of the invention, the resilient member supporting the coil is bent into a U-shape with the coil mounted inside the U-shaped member. Thus in this embodiment the resilient member has two bending knees which still further improves the sensitivity of the detector.

According to another embodiment of the detector of the invention, the detecting device is a light source directing a light beam toward a reflector fixed to the coil, and means for recording the movement of the reflected light beam. If the recording means is situated at a long distance from the reflector of the coil, the coil movement will be translated into large readings at the recording means. Thus a detecting device with a high sensitivity is achieved.

In other embodiments of the detector according to the invention, the detecting device can be formed by means for recording the interference pattern produced by incoming and reflected light to determine the movement of the coil from this pattern, or the detecting device can be a variable capacitance device of the kind used in, e.g., capacitive microphones.

According to another version of this last embodiment, the capacitor is selected in combination with the inductance of the coil such that the resulting electrical resonance frequency agrees with the mechanical resonance frequency of the system carrying the coil. An efficient transfer of energy will then be possible, that is, a maximum efficiency is obtained. This is of particular importance when using the detector according to the invention in, for instance, a pacemaker, in which no circuit is allowed to have a current consumption exceeding 1 µA.

According to another embodiment of the detector of the invention, the current source supplies an adjustable DC current to the coil in addition to the current pulses. This DC current results in a new operating point and in this way the electrical resonance frequency can be adjusted.

DESCRIPTION OF THE DRAWINGS

FIG. 1 shows an elevational view and FIG. 2 a side view of a first embodiment of a magnet position detector according to the invention based on the principle of a moving coil.

FIG. 3 shows equivalent electrical circuits of the detector together with electric signals used in its operation.

FIGS. 4 and 5 show another coil assembly of the detector according to the invention.

FIGS. 6 and 7 schematically illustrate two different locations of the detector coil in relation to a magnet.

DESCRIPTION OF THE PREFERRED EMBODIMENTS

Figure 8:
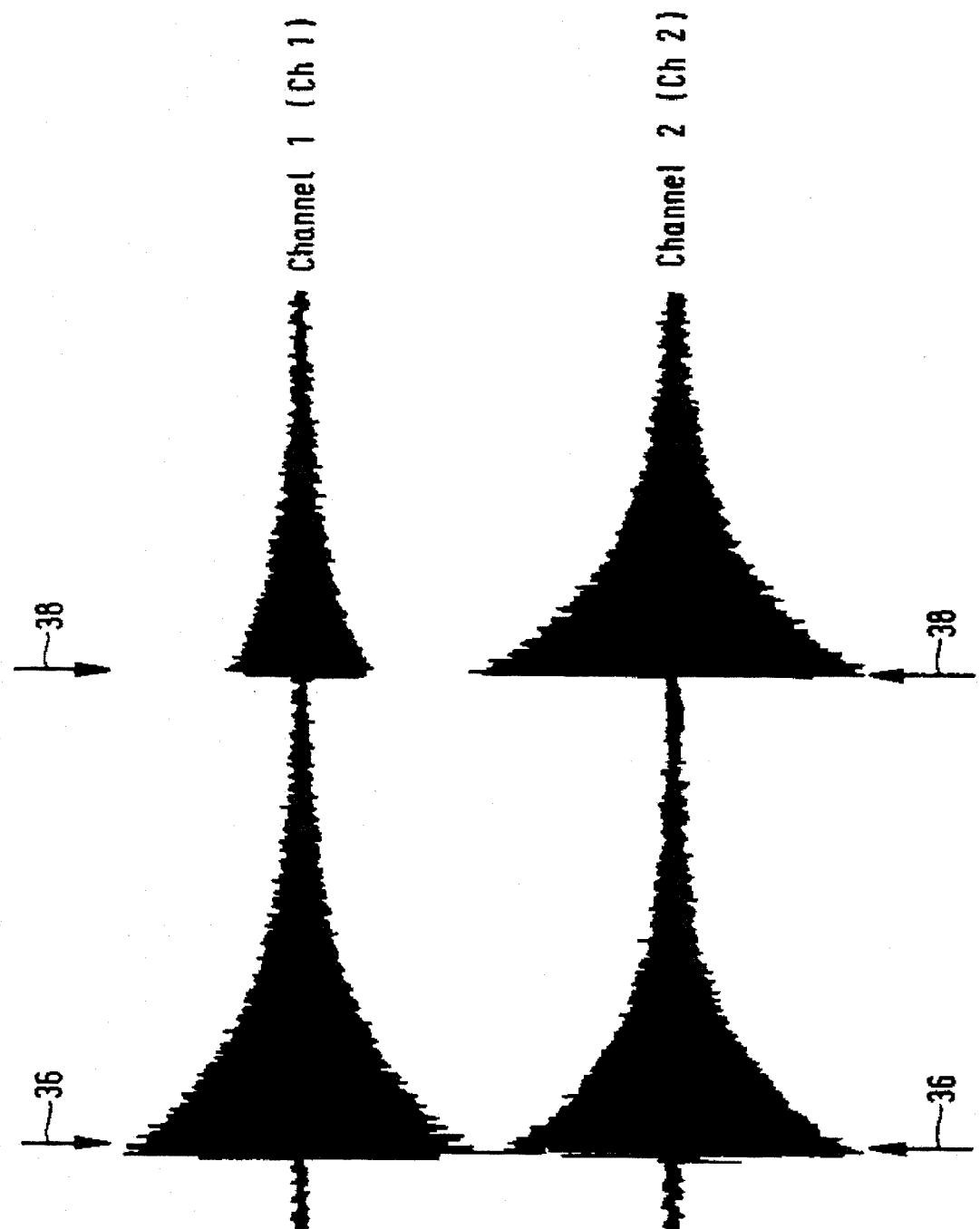
FIG. 8 shows signals from the detector according to the invention for describing its functioning.

FIGS. 1–3 illustrate the construction and functioning of a magnet position detector according to the invention. The detector is provided with a coil 2 mounted at the free end of a piezoelectric bar 4 which is attached to a base 6 at its opposite end. The electronic circuitry 8 of the detector is also mounted on the base 6. The coil is provided with a core having a non-linear B-H curve, preferably a ferrite core which will also give the coil 2 a high inductance.

The electronic circuitry 8 includes a current source which through the pins a and b of the electronic circuitry 8 is connected to the coil 2. This current source can supply an adjustable DC current to the coil to adjust the operating point of the electrical equipment of the detector. This current source can also be operated as a pulse generator delivering electric pulses directly to the coil 2.

Square pulses are preferably delivered from the electronic circuitry 8 to the coil 2 through a capacitor 10, connected between the pins b and c of the electronic circuitry.

The capacitor 10 is connected in series with the coil 2 and the value of the capacitor 10 is selected such that the electrical resonance frequency of the electrical circuit will be close to the resonance frequency of the oscillating mechanical system. In this way a maximum coupling is obtained with an efficient energy transfer as a result.

Pulses delivered by the electronic circuitry 8 are differentiated by the capacitor 10 and the pulse edges will pass the capacitor and reach the coil 2. If the coil is located in a magnetic field the current passing the coil 2 will excite an oscillation in the piezoelectric bar 4. This oscillation is observed as an electric signal across the piezoelectric bar 4 and supplied to the pins e and f of the electronic circuitry 8 (pin d being unconnected).

Because of the above mentioned resonance, the square pulse will generate a strongly damped electric pulse in the coil 2 with the same polarity as the sides of the square pulse.

Thus the oscillations generated by the leading and trailing edges of the square pulse are similar but of opposite directions.

To get a sufficiently high inductance the coil 2 is preferably provided with a ferrite core as mentioned above. Typical figures of the components are inductance L= 350 nH, resistance R (of the coil 2, or of a discrete resistor connected in series with the coil 2)= 1 kohm, capacitance C= 150 nF and square pulses are delivered with a frequency of the order of 110 Hz.

FIG. 3 shows the electrical equivalent to the components connected to the electronic circuitry in FIGS. 1 and 2 as well as the signals appearing in the circuit.

The block 12 in FIG. 3 illustrates pulses generated by the pulse generator in the electronic circuitry 8 and fed to the coil 2 through the capacitor 10.

The pulse train is also fed to an oscilloscope 16 which on channel 1 (Ch 1) shows a pulse with an expanded time scale as compared to the pulses shown in square 12.

The pulses supplied to the coil 2 produce an oscillation of the piezoelectric bar 4 in the presence of a magnetic field. The oscillations of the piezoelectric element give rise to a corresponding electric signal delivered to the pins e and f of the electronic circuitry 8. In the electronic circuitry 8 the signal from the piezoelectric bar 4 is high pass filtered as shown in block 14, and is supplied to channel 2 (Ch 2) of the oscilloscope, square 16. As shown in the oscillogram, a damped oscillation of the piezoelectric bar is produced by the two edges of the pulse, the oscillations at the leading and trailing pulse edges being in opposite phase.

FIGS. 4 and 5 show an advantageous arrangement for mounting the coil 2 on the resilient member. In this embodiment the resilient member is formed of a U-shaped sheet 18, the coil 2 being mounted inside the U-shape at the free end portion of the upper shank in the figures of the U-shaped member. The resilient member is attached to a base or carrier (not shown in FIGS. 4 and 5) at the end portion of the lower shank in FIGS. 4 and 5.

The sheet 18 is formed of a flexible element of metal such as stainless steel, bronze, titanium, or a plastic material.

On the outer side of the U-shaped member a piezoelectric sheet 20 is fixed over the bends 22 and 24 and the web of the U-member.

The embodiment shown in FIGS. 4 and 5 is more flexible than the construction with a straight bar shown in FIGS. 1 and 2 and results in a lower resonance frequency for essentially the same dimensions of the mechanical system. Further a larger bending, essentially in the bends 22 and 24, is obtained in this embodiment when the coil 2 is tilted. The piezoelectric element 20 delivers a corresponding electric signal to the electronic circuitry 8 and in this way a more sensitive detector is obtained.

To the left in FIGS. 4 and 5 a permanent magnet 26 is shown with its south pole directed towards the coil 2. The coil 2 is centered on the symmetry axis illustrated with the arrow 28. In FIG. 4 the coil 2 is fed with current such that it has a north pole at its upper end and its south pole at the lower end. In FIG. 5 the current, and consequently the poles of the coil 2 are reversed. The arrows 30 and 32 above and below the coil 2 respectively illustrate forces which are acting on the coil because of the magnet 26. As shown, the coil 2 is affected by oppositely directed forces in FIGS. 4 and 5 which will tilt the coil 2 in different directions. Correspondingly different electric signals are then delivered by the piezoelectric element 20. Thus with the detector according to the invention the polarity of the magnet 26 can be determined.

When determining the position of a magnet 34 in FIGS. 6 and 7 the coil 2 shall preferably be perpendicular to the magnet 34. A maximum signal is obtained from the detector when the coil 2 is centered on the symmetry axis of the magnet 34. This position is schematically shown in FIG. 6.

In FIG. 7 the coil 2 is displaced a distance from the axis and in this position of the coil 2 the oscillations excited by the leading and trailing edges of the current pulse will be different and signals of different strength will be delivered by the detector because of the non-linear B-H curve of the coil core. This is illustrated in FIG. 8. Channel 1 (Ch 1) of the oscillogram in FIG. 8 shows the signals with the coil 2 displaced in relation to the symmetry axis of the magnet 34 as the signals generated by the two edges of the excitation pulse are of different strength. The signals generated by the two pulse edges are marked by the arrows 36 and 38. The signals on channel 2 (Ch 2) of the oscillogram illustrate a situation where the coil 2 is centered on the symmetry axis of the magnet 34. As can be seen in the oscillogram, the signals produced by the two pulse edges are equal in this case.

Thus with the detector according to the invention it is possible to detect small displacements from the magnet symmetry axis, and consequently to control and localize the position of a magnet.

Figure 9:
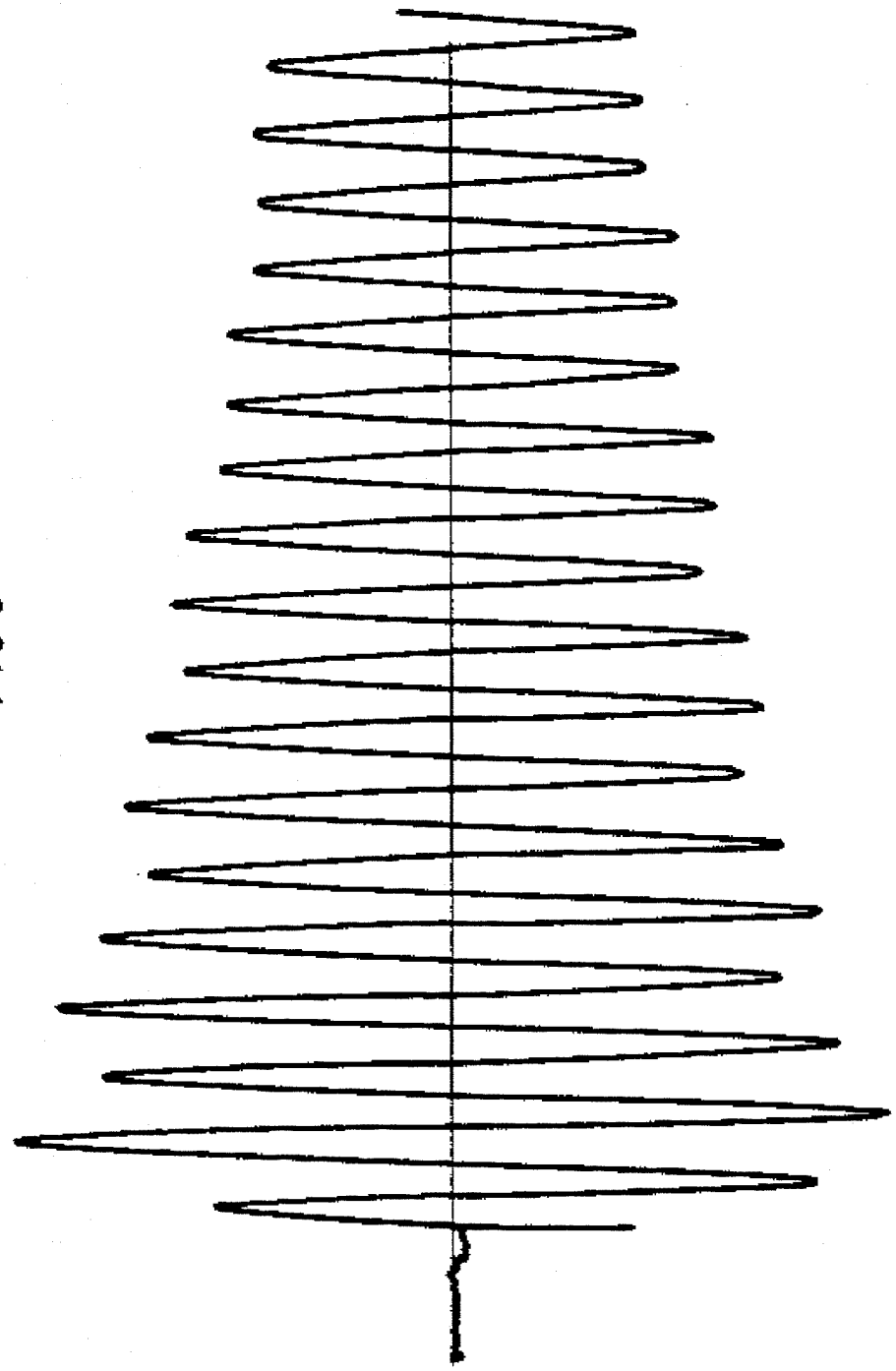
FIG. 9 shows the detector signal with an expanded time scale.

FIG. 9 shows the signal of channel 2 in FIG. 8 with an expanded time scale. This oscillogram shows that the oscillation frequency is of the order of 400 Hz in this particular case.

Figure 10:
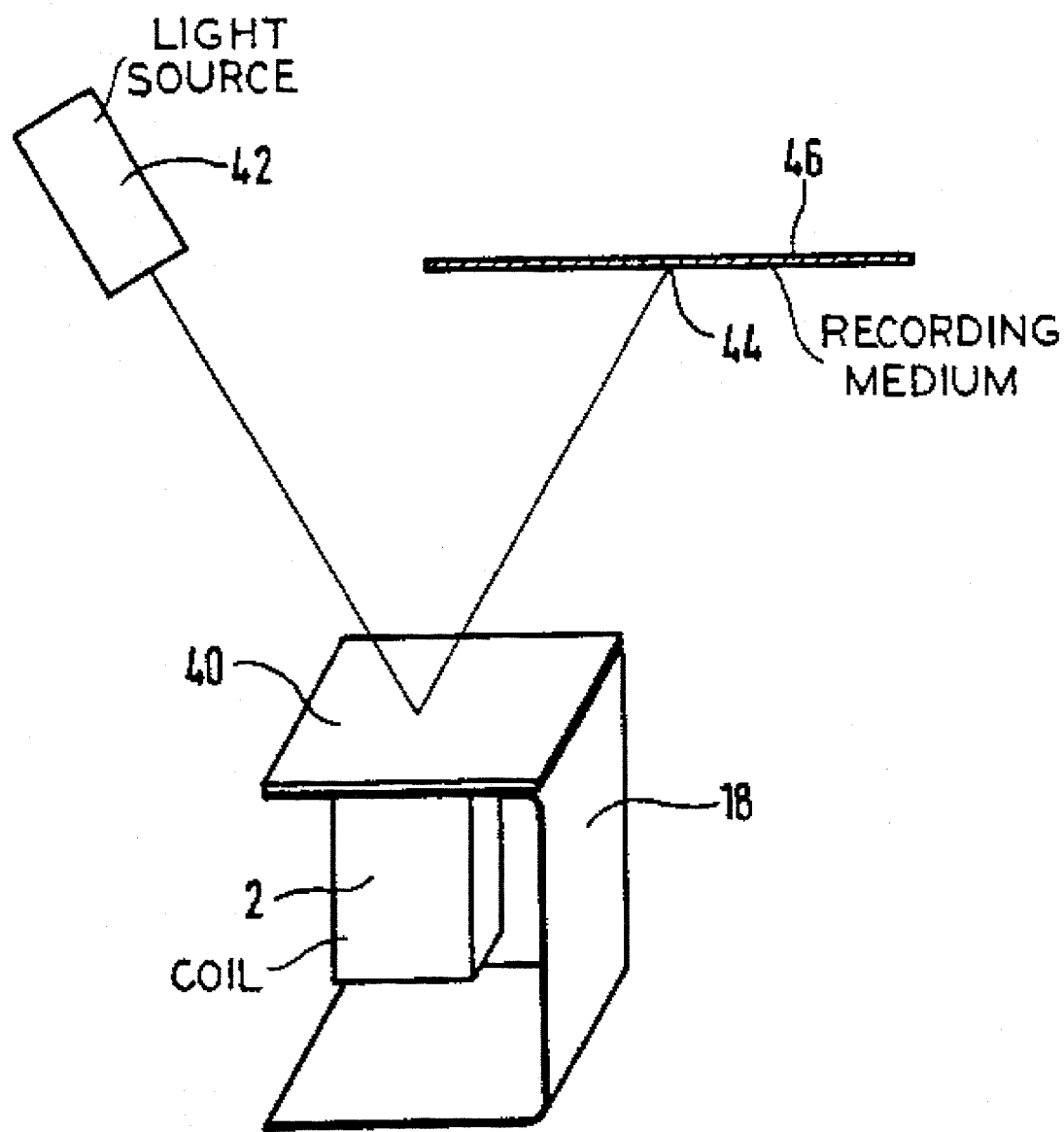
FIGS. 10–12 respectively schematically show three different types of detecting devices for determining the movement of the coil of the detector according to the invention.

FIG. 10 illustrates an alternative means for detecting the oscillations of the coil 2. The outer surface 40 of the shank of the flexible member 18 on which the coil 2 is mounted is provided with a reflector, or formed as a reflecting surface. A light source 42, preferably a laser, directs a light beam toward the reflecting surface 40 and the reflected beam is recorded by suitable recording means or recording medium 46. Thus the reflected beam will create a luminous point 44 on the recording medium 46 which point will describe the oscillation of the coil 2 and the shank on which it is mounted.

Figure 11:
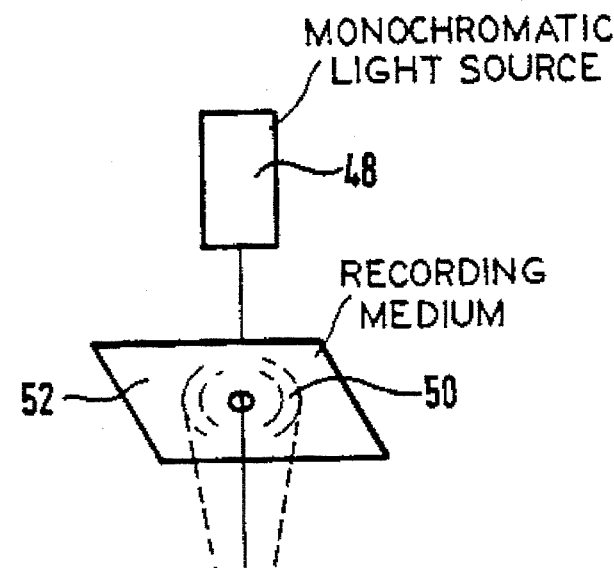

FIG. 11 illustrates an embodiment in which the oscillation of the coil 2 and the flexible member 18 is detected by an interference technique. Also in this case the outer side of the shank on which the coil 2 is mounted is provided with a reflector or a reflecting surface 40. A monochromatic light source 48 directs a light beam toward the reflecting surface 40 and the interference pattern 50 produced by the direct incoming light and the reflected light will reproduce the oscillation of the coil 2 and the flexible member 18. The interference pattern 50 is recorded on a suitable recording medium 52. The appearance of the interference pattern 50 will be determined by the tilting of the coil 2 and consequently be used as a measure of the tilting and thus of the magnetic field strength.

Figure 12:
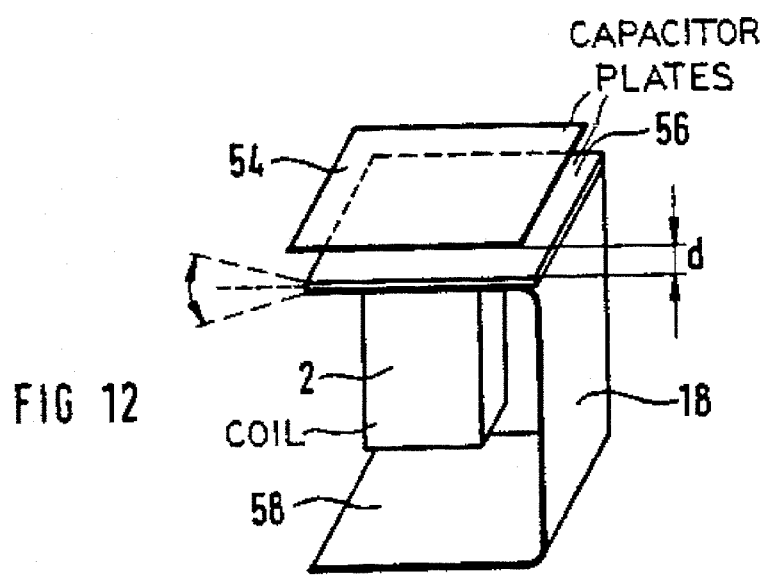

FIG. 12 illustrates a further alternative means for detecting the movement of the coil 2 and the flexible member 18 using a variable capacitance device. The capacitance device has one essentially stationary condenser plate 54 (the fixing of the plate 54 not shown in the figure) and one condenser plate 56 mounted on the shank of the U-shaped member 18 which is carrying the coil 2. Thus when the coil 2 is moving, the condenser plate 56 will move together with the coil 2 and the resulting variation in the distance d between the two condenser plates 54 and 56 will result in a capacitance which varies in response to the movement of the coil 2. This capacitance will consequently be a measure of the magnetic field measured by the detector.

Instead of using a separate fixed condenser plate 54 the lower shank of the U-shaped member 18 can form the fixed plate 58 of the variable capacitance device.

As the detector according to the invention can be used to detect both position and polarity of a magnet it has several applications.

In the medical field the detector can be used to detect the presence of a magnet and its position. For implanted medical devices, like pacemakers, a magnet is often used for testing purposes. The battery status can, for instance, be detected by the application of a magnet to the implanted device. The exact location of the implanted device can often be difficult to determine and therefore it is also difficult to ascertain the correct location at which the magnet should be placed in relation to, e.g., a reed switch within an implanted pacemaker. This problem can be solved by the detector according to the invention which makes it possible to determine the best position of the magnet.

The detector according to the invention can, however, be used as a more general position indicator and the detector can be used to guide an object along a predetermined path, e.g., towards a target.

Although modifications and changes may be suggested by those skilled in the art, it is the intention of the inventor to embody within the patent warranted hereon all changes and modifications as reasonably and properly come within the scope of his contribution to the art.

I claim as my invention:

1. A device for identifying the position of a magnet comprising:

an electrical coil having a core with a non-linear B-H curve;

means for resiliently supporting said coil including a resilient bar member consisting of piezoelectric material to which said coil is fixed, said bar member being bent by movements of said coil and delivering an electrical signal representative of the bending of said bar member;

means for generating current pulses each having a leading edge and a trailing edge;

means for differentiating said pulses to obtain differentiated signals of opposite polarity respectively corresponding to said leading and trailing edges and for supplying said differentiated signals to said coil while said coil is in the presence of a magnetic field produced by a magnet, and thereby causing oscillating movement of said coil in opposite directions and corresponding bending of said bar member in said opposite directions; and detector means for receiving said electrical signal representative of the bending of said bar member in each of said opposite directions for detecting movements of said coil in said magnetic field caused by said leading and trailing edges of said pulses and for comparing the respective magnitudes of said movements in said opposite directions with each other.

2. A device as claimed in claim 1 wherein said coil has a ferrite core.

3. A detector as claimed in claim 1 wherein said bar member comprises a member forming two shanks, each shank having a first end at which said two shanks are interconnected and a second, free end, said coil being mounted at said free end of a first of said shanks and said bar member being rigidly fixed at said free end of a second of said shanks.

4. A device as claimed in claim 3 wherein said bar member comprises a U-shaped member.

5. A device as claimed in claim 4 wherein said coil is mounted inside said U-shaped member.

6. A device for identifying the position of a magnet comprising:

an electrical coil having a core with non-linear B-H curve;

means for resiliently supporting said coil including a resilient bar member having a piezoelectric element attached thereto, said bar member being bent by movements of said coil and said piezoelectric element delivering an electric signal representative of the bending of said bar member;

means for generating current pulses each having a leading edge and a trailing edge;

means for differentiating said pulses to obtain differentiated signals of opposite polarity respectively corresponding to said leading and trailing edges and for supplying said differentiated signals to said coil while said coil is in the presence of a magnetic field produced by a magnet, and thereby causing oscillating movement of said coil in opposite directions and corresponding bending of said bar member in opposite directions; and detector means for receiving said electrical signal representative of the bending of said bar member in said opposite directions for detecting movements of said coil in said magnetic field caused by said leading and trailing edges of one of said pulses and for comparing the respective magnitudes of said movements in said opposite direction with each other.

7. A detector as claimed in claim 6 wherein said bar member comprises a member forming two shanks, each shank having a first end at which said two shanks are interconnected and a second, free end, said coil being mounted at said free end of a first of said shanks and said bar member being rigidly fixed at said free end of a second of said shanks.

8. A device as claimed in claim 7 wherein said bar member comprises a U-shaped member.

9. A device as claimed in claim 8 wherein said coil is mounted inside said U-shaped member.

10. A device as claimed in claim 8 wherein said piezoelectric element comprises a sheet of piezoelectric material applied to an outer side of said U-shaped member covering a curved region of U-shaped member between said two shanks.

11. A device as claimed in claim 6 wherein said piezoelectric element covers a region of said resilient member between said two shanks.

12. A device for identifying the position of a magnet comprising:

an electrical coil having a core with non-linear B-H curve;

means for resiliently supporting said coil having a surface co-moveable with the coil;

means for generating current pulses each having a leading edge and a trailing edge;

means for differentiating said pulses to obtain differentiated signals of opposite polarity respectively corresponding to said leading and trailing edges and for supplying said differentiated signals to said coil while said coil is in the presence of a magnetic field produced by a magnet, and thereby causing oscillating movement of said coil in opposite directions and corresponding bending of said surface in said opposite directions; and detector means including a light reflector fixed to said coil for co-movement therewith, a light source which directs a light beam onto said surface causing a reflected light beam to be reflected by said surface, means for recording movement of said coil in said magnetic field when the coil is supplied with said differentiated signals by measuring said reflected light beam, and means for comparing the respective magnitudes of the movements of said coil in said opposite directions caused by the leading and the trailing edges of one of said pulses.

13. A device for identifying the position of a magnet comprising:

an electrical coil having a core with non-linear B-H curve;

means for resiliently supporting said coil having a surface co-moveable with the coil;

means for generating current pulses each having a leading edge and a trailing edge;

means for differentiating said pulses to obtain differentiated signals of opposite polarity respectively corresponding to said leading and trailing edges and for supplying said differentiated signals to said coil while said coil is in the presence of a magnetic field produced by a magnet, and thereby causing oscillating movement of said coil in opposite directions and corresponding bending of said surface in said opposite directions; and detector means including a reflector fixed to said coil for co-movement therewith, a monochromatic light source which directs an incoming light beam toward said reflector for producing a reflected light beam from said surface, means disposed between said monochromatic light source and said reflector for recording an interference pattern produced by said incoming and reflected light beams, said interference pattern being representative of the movement of said coil in said opposite directions in said magnetic field when the coil is supplied with said differentiated signals and means for comparing the respective magnitudes of the movements of said coil in said opposite directions caused by the leading and the trailing edges of one of said pulses.

14. A device for identifying the position of a magnet comprising:

an electrical coil having a core with non-linear B-H curve;

means for resiliently supporting said coil having a surface co-moveable with the coil;

means for generating current pulses each having a leading edge and a trailing edge;

means for differentiating said pulses to obtain differentiated signals of opposite polarity respectively corresponding to said leading and trailing edges and for supplying said differentiated signals to said coil while said coil is in the presence of a magnetic field produced by a magnet, and thereby causing oscillating movement of said coil in opposite directions and corresponding bending of said surface in said opposite directions; and detector means including a variable capacitance having one stationary plate and one movable plate, said movable plate being mechanically coupled to said surface for co-movement therewith, means for detecting variations in capacitance of said variable capacitance caused by movement of said plate coupled to said surface in said opposite directions when the coil is supplied with said differentiated signals and means for comparing the respective magnitudes of the movements of said coil in said opposite directions caused by the leading and the trailing edges of one of said pulses.

* * * * *